United States Patent [19]

Dranchak et al.

[11] Patent Number: 4,907,975
[45] Date of Patent: Mar. 13, 1990

[54] ELECTRICAL CONNECTOR UTILIZING FLEXIBLE ELECTRICAL CIRCUITRY

[75] Inventors: David W. Dranchak, Endwell; David E. Engle, Vestal; David E. Hessian, Binghamton; Alan D. Knight, Newark Valley; Wai M. Ma, Endicott; Thomas G. Macek, Endicott; John J. Squires, Endicott, all of N.Y.

[73] Assignee: International Business Machine Corporation, Armonk, N.Y.

[21] Appl. No.: 285,971

[22] Filed: Dec. 19, 1988

[51] Int. Cl.[4] .............................................. H01R 9/09
[52] U.S. Cl. ......................................... 439/67; 439/77; 439/493; 439/632
[58] Field of Search ................... 439/67, 77, 260, 265, 439/493, 499, 631, 632, 636

[56] References Cited

U.S. PATENT DOCUMENTS

| | | | |
|---|---|---|---|
| 3,102,767 | 9/1963 | Schneck | 439/493 |
| 3,158,421 | 11/1964 | Hasenauer, Jr. | |
| 3,614,707 | 10/1971 | Kaufmann et al. | 439/260 |
| 3,772,775 | 11/1973 | Bonnke et al. | 29/628 |
| 3,825,878 | 7/1974 | Finger et al. | 439/493 |
| 3,977,756 | 8/1976 | Rodondi | 339/176 |
| 4,060,889 | 12/1977 | Zielinski | 29/628 |
| 4,087,146 | 5/1978 | Hudson, Jr. | 339/17 |
| 4,416,497 | 11/1983 | Brandsness et al. | 339/17 |
| 4,480,884 | 11/1984 | Babuka et al. | 339/17 |
| 4,587,596 | 5/1986 | Bonnell | 439/493 |
| 4,647,140 | 3/1987 | Crawford | 339/176 |
| 4,695,258 | 9/1987 | Hanson et al. | 439/67 |
| 4,717,345 | 1/1988 | Gordon et al. | 439/67 |
| 4,744,764 | 5/1988 | Rubenstein | 439/62 |
| 4,768,971 | 9/1988 | Simpson | 439/67 |
| 4,798,541 | 1/1989 | Porter | 439/77 |
| 4,808,112 | 2/1989 | Wood et al. | 439/67 |
| 4,824,379 | 4/1989 | Roberts et al. | 439/77 |
| 4,838,798 | 6/1989 | Evans et al. | 439/493 |
| 4,850,883 | 7/1989 | Kabadi | 439/67 |

Primary Examiner—P. Austin Bradley

[57] ABSTRACT

An assembly for interconnecting two relatively rigid circuit cards using a flexible circuit for forming this connection is provided. The assembly includes a housing which has a first pressure exerting member which has the flexible circuit reeved therearound. Second and third pressure exerting members are provided in spaced juxtaposed relationship against which the opposite legs of the flexible circuit are maintained to define therebetween a slot for the reception of a circuit card. The assembly is inserted into a card substrate with the first pressure exerting means causing the flexible circuit to be biased into contact with the contacts on a substrate. A second circuit card is inserted into the slot between the legs of the flexible circuit, and the second and third pressure exerting members urge each of the legs as the flexible circuit into contact with the second circuit board.

10 Claims, 4 Drawing Sheets

ELECTRICAL CONNECTOR UTILIZING FLEXIBLE ELECTRICAL CIRCUITRY

BACKGROUND OF THE INVENTION

This invention relates generally to the interconnection of circuit boards or circuit cards, and more particularly to the interconnection of two circuit boards or cards to substrate utilizing a flexible circuit member.

Flexible circuits are being used increasingly for the electrical connection of two circuit boards or circuit cards, or cable cards, or other relatively rigid electrical structures to various substrates. The use of flexible circuitry has several advantages over various prior art types of connections. It is especially advantageous over soldered or other bonded connections in that it does not have the inherent problems of improper solder joints nor does it require the relatively large amount of space that is required for solder connections. Flexible circuitry also provides a relatively easily made, good contacting connection, which does not require the overcoming of frictional forces encountered in pin insertion, and which can be used in very small areas to provide very high density circuit connections such as are required in the printed circuit technology, especially various aspects of computer circuit technology.

There have been many prior proposals for various types of flexible contact connections. These are represented by the following U.S. Pat. Nos. 4,695,258; 4,087,146; 4,060,889; 4,717,345; 4,744,764; 4,647,140; and 4,480,884. However, none of these patents teach or suggest the circuit interconnection, as described herein, in which a flexible circuit can be used to provide a good secure connection between two boards and which is especially adapted to contact both sides of one board to one side of the other board.

SUMMARY OF THE INVENTION

According to the present invention, an assembly for interconnecting a flexible circuit member to connectors on a substrate member and connectors on a card member is provided. The assembly includes a housing member with a first pressure exerting member carried by the housing and adapted to receive a flexible circuit member reeved therearound and further positioned to urge the reeved portion of the flexible circuit against the connectors on the substrate to cause electrical contact. Second and third pressure exerting members are provided which are carried by the housing and positioned in spaced juxtaposed relationship to define an opening therebetween. Means are provided to maintain one leg of the flexible circuit in contact with the second pressure exerting member and the other leg of the flexible circuit in contact with the third pressure exerting member, with the two legs defining therebetween a slot to receive a circuit board, the slot being of less width than the thickness of the circuit board. Thus when the board is inserted in the slot and the reeved portion is in contact with the connectors on the substrate, a circuit connection is established between the substrate and the card through the flexible circuit.

DESCRIPTION OF THE PREFERRED EMBODIMENT

Figure 1:
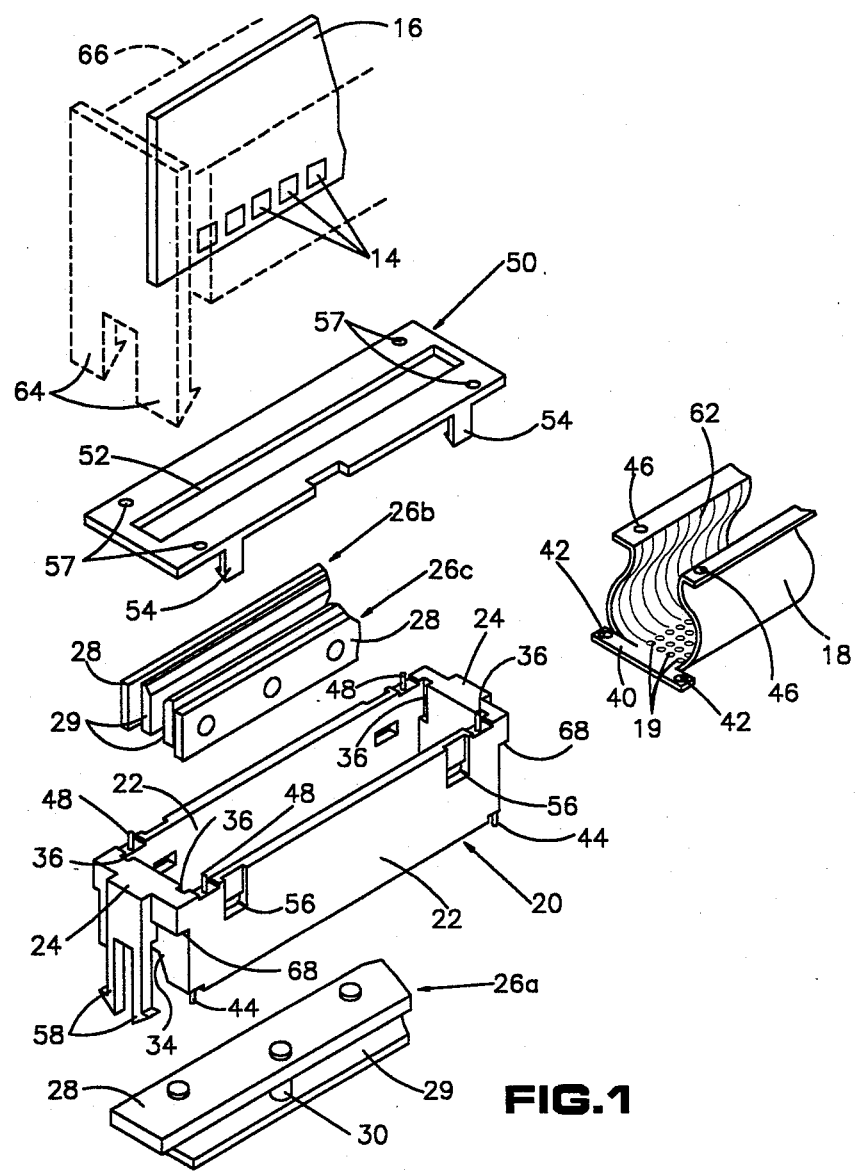
FIG. 1 is an exploded prospective view of an assembly according this invention connecting a circuit card to a substrate using a flexible circuit member.

Referring now to the drawing, an assembly is provided for connecting the contacts 10 on a substrate 12 to connector pads 14 on a cable card 16. The contacts 10 and connector pads 14 may be of any configuration. For example, the contacts 10 preferably are as shown and described in U.S. patent application Ser. No. 7,287,236; Filed Dec. 21, 1988, entitled Connector for Connecting Flexible Film Circuit Carrier to Board or Card and Use Thereof. The connector pads 14 can conventionally be deposited metallurgy as is well known in the art. However, other types of connector and connector pads can be used.

The interconnection of the contacts 10 to connector pads 14 is done through a flexible circuit 18, the central portion of which is provided with plated through holes 19, in order to provide the necessary interconnection between the opposite sides of the flexible circuit 18 as will become apparent presently. The assembly includes a housing 20, which is comprised of a pair of side plates 22 and a pair of end plates 24.

Figure 2:
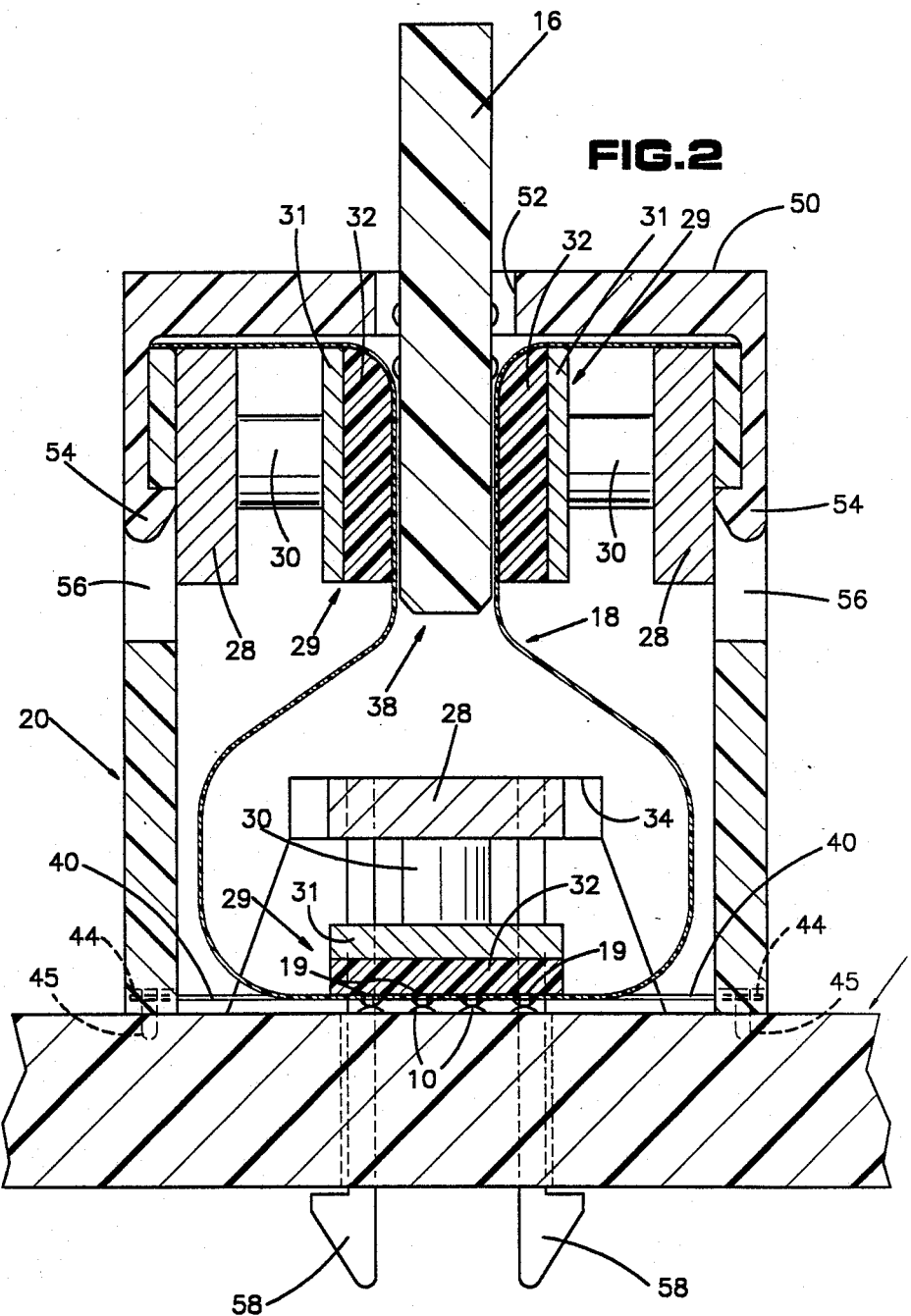
FIG. 2 is a longitudinal sectional view, somewhat diagrammatic and on a larger scale from FIG. 1, showing the assembly a flexible connector assembly interconnecting a substrate and a card.

Three pressure exerting member 26a, 26b, and 26c are provided for securing the flexible circuit 18 in the housing. Each pressure exerting member 26a, 26b and 26c is comprised of a metal support plate 28, a resilient element 29 and compression elements 30, which are generally cylindrical in shape and formed of an elastomeric material. As can be seen in FIG. 2, each resilient element 29 is formed of a solid rigid material 31, such as aluminum, which has bonded thereon a pad of elastomeric material 32. (If desired, the pads 32 of elastomeric material may be rounded slightly in members 26b and 26c as shown in FIG. 2.) The construction of these resilient members is shown and described in U.S. patent application Ser. No. 266,538, filed Nov. 3, 1988 entitled Electrical Connector Assembly Including Pressures Exertion Member. The pressure exerting member 26a is secured in the housing 20 by means of a pair of transverse slots 34, one in each end plate 24, which retain the metal support plate 28 therein by means of pins (not shown) with the elastomeric pad 32 disposed downwardly therefrom. The resilient members 26b and 26c are deposed within the housing 20 in vertical slots 36 in the end plates 24, so as to form a space or opening 38 there between.

The flexible circuit 18 is reeved around the elastomeric pad 32 of the pressure exerting member 26a with legs extending upwardly on both sides thereof shown in FIG. 2.

The flexible circuit 18 is provided with a pair of tabs, one of which is shown at 40, each of which tabs 40 has a pair of locating holes 42, which locating holes are adapted to mate on locating pins 44 extending downwardly from the housing 24 and mating with blind holes 45 in the substrate 12. The co-action of the holes 42 and pins 44 and mating holes 45 in substrate 12 will properly locate the portion of the flexible circuit which is reeved around the elastomeric pad 32 of the resilient member 26a.

The two opposite legs of the flexible circuit 18 are disposed on opposite sides of the space 38 against the elastomeric pads 32 of the pressure exerting members 26b and 26c as shown in FIG. 2. The legs are maintained in position by means of a second set of locating holes 46 formed in the legs of the flexible circuit 18, which mate with a second set of locating pins 48, which extend upwardly from the top of the housing 20. This configuration will assure proper alignment of the flexible circuit within the space or opening 38 seated against the resilient pads 32 of the resilient members 26.

A cover member 50 is provided to maintain the components of the assembly within the housing and includes a longitudinal slot 52 which is in alignment with the opening 38. The cover 50 snaps onto the housing and is held in place by means of resilient snaps 54, which snap onto catches 56 formed in the housing. The cover also includes a set of holes 57 positioned to receive the locating pins 48 and thus secure the legs of the flexible circuit 18.

In order to form the circuit connection, the housing, which is assembled with the flexible circuit therein and the cover thereon is snapped into place onto the substrate 12 being properly retained thereon by means of resilient legs 58 formed on the housing 20, which legs 58 extend through openings 60 in the substrate 12. This will bring the housing carrying the flexible circuit into contact with the contacts 10 on the substrate 12 with the pressure exerting member 26a exerting pressure against the flexible circuit 18 so that pad surrounding the plated through holes 19 on the flexible circuit make solid firm connection with the contacts 10. The combined action of the compression elements 30 and the elastomeric pads 32 bias the flexible circuit into contact with the contacts 10, with the elastomeric pad 32 also acting as a conformed element to allow for variations in surface topography of the substrate 12 and contacts 10.

The cable card 16 is inserted into the slot 38 perpendicular to the substrate 12 between the opposite legs of the flexible circuit 18. The pressure exerting members 26b and 26c exert pressure against the flexible circuit 18 causing the contacts 14 to make contact with circuitry 62 which may include contact pads on the flexible circuit 18. The action of the pressure exerting members 26b and 26c on the flexible circuit 18 is the same as described with respect to pressure exerting member 26a. The card 16 is retained in card cover 66 which will snap into place by means of legs 64 snapping over the edges 68 of end plates 24 on housing 20.

It should be noted that the width of the slot 38 should be narrower than the thickness of the cable card 16 to insure proper pressure or force action of the resilient members 26b and 26c against the connectors 14 on the card 16 to assure desired electrical contact.

Also, as was noted above, the flexible circuit 18 has circuitry on both sides thereof with plated through holes 19 providing the electrical interconnection between both sides of the flexible circuit and hence both sides of the card. It will be apparent from an examination of the drawing that as this particular embodiment is configured, it is necessary to provide electrical interconnections between both sides of the circuit inasmuch as the configuration provides electrical connection to the substrate 12 on one side of the flexible circuit 18 and interconnection on the other side of the flexible circuit 18 to the card 16.

Figure 3:
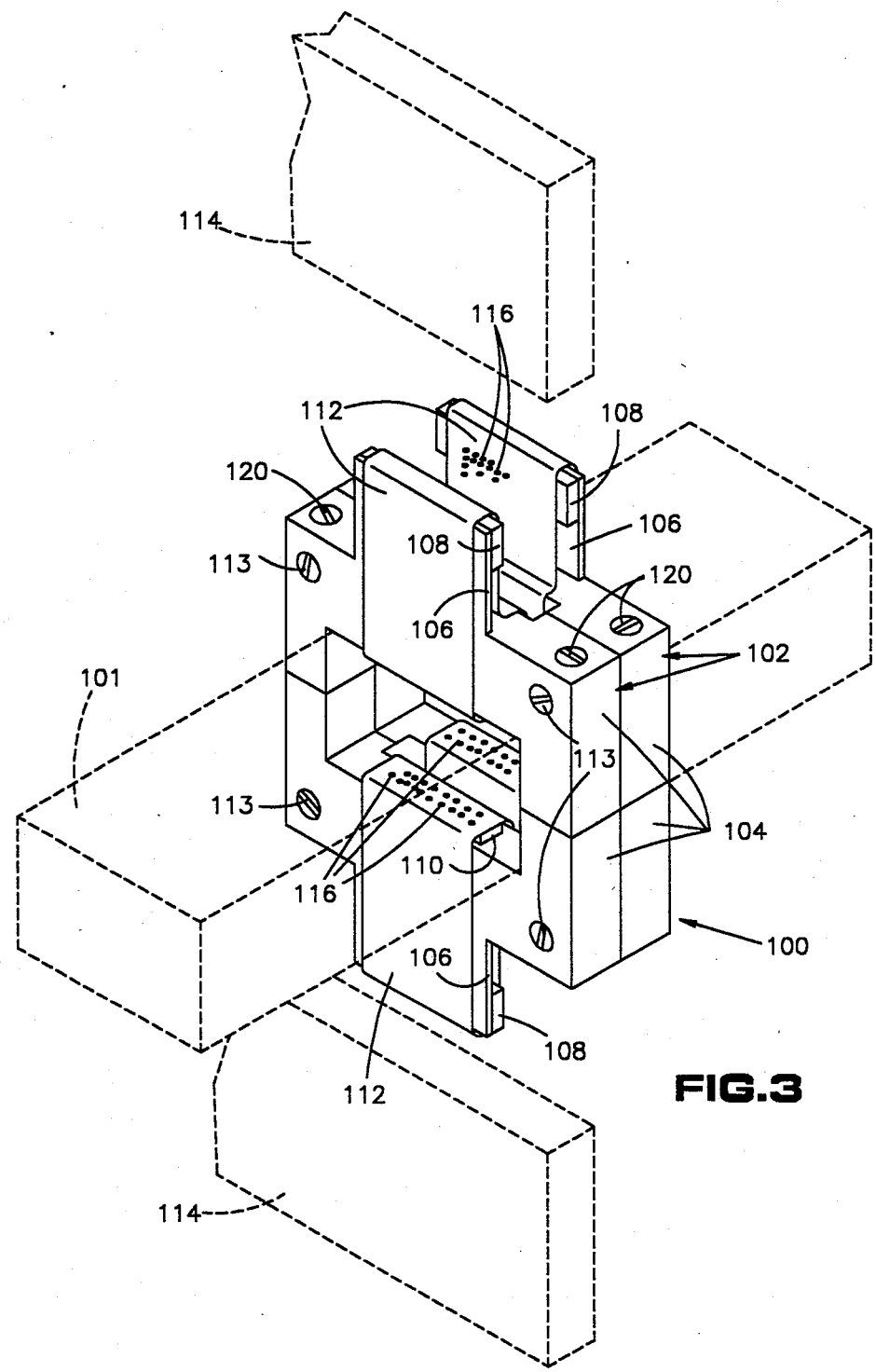
FIG. 3 is a perspective view, somewhat diagrammatic of another embodiment of this invention.
Figure 4:
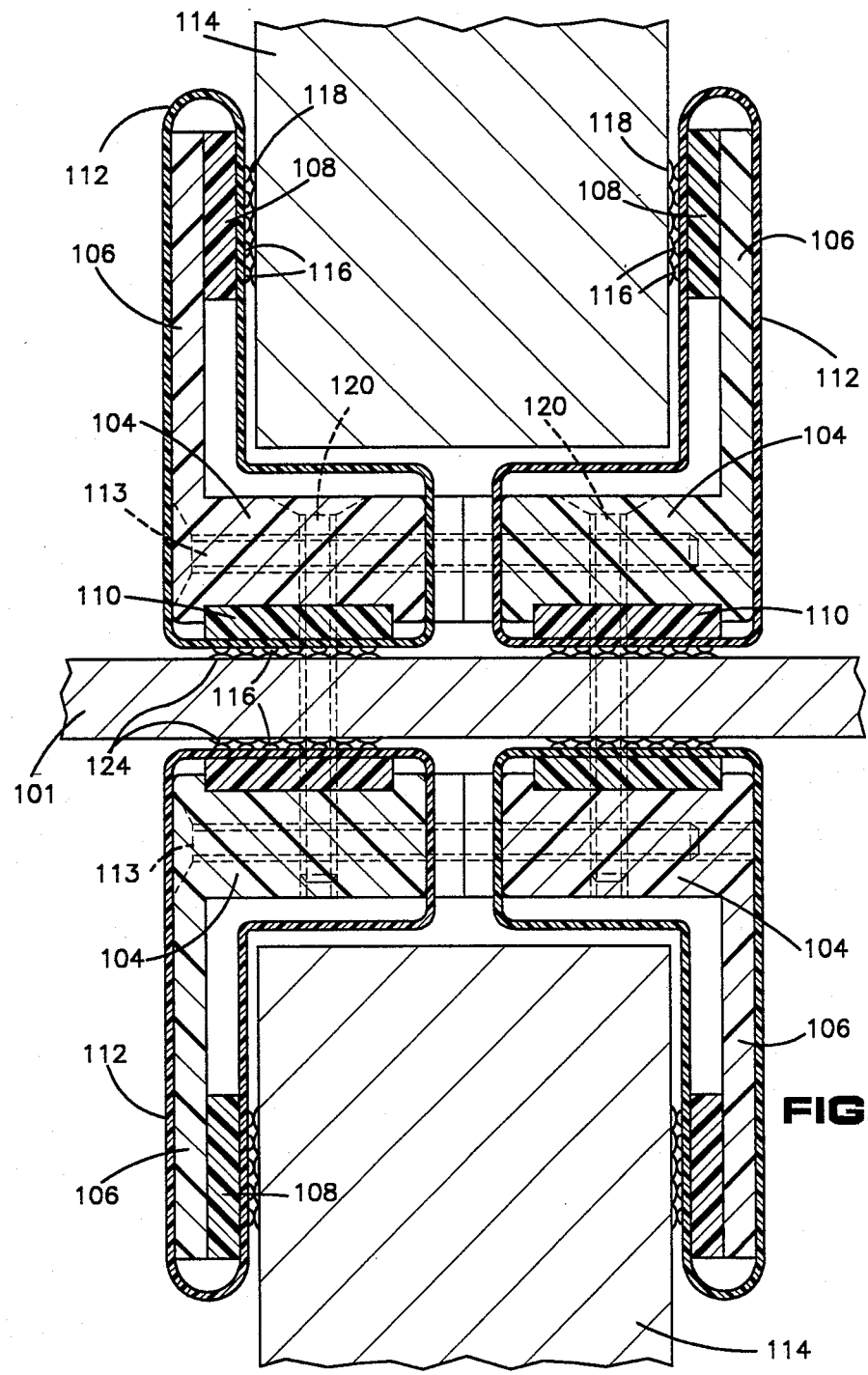
FIG. 4 is a longitudinal sectional view of the device of FIG. 3.

FIGS. 3 and 4 show a somewhat modified embodiment of the invention. The principles of operation are similar to that of the embodiment of FIGS. 1 and 2, but in this embodiment a pair of flexible circuits are used, and the housing is adapted to mate with a similar housing to provide connection to opposite sides of a circuit card.

In this embodiment, a housing member 100 is provided on each side of a substrate 101. Each housing member 100 is comprised of a pair of mating sections 102 which sections are identical, but arranged in an opposed mirror image relationship. Each section 102 has a support block 104 which supports a resilient spring arm 106. Each spring arm 106 mounts on elastomeric pad 108 and each support block 104 mounts a similar elastomeric pad 110. A flexible circuit 112 is reeved around both pads 108 and 110 in each section of each housing member 100 as shown in FIG. 4 and held in place by suitable means (not shown). The sections 102 of each housing are held together by means of bolts 113 passing through openings (unnumbered) in each housing section 102. Circuit cards 114 are disposed between the arms 106 of each housing, and the resiliency of the arms 106 forces contacts 116 on the flexible circuit 112 into contact with contact pads 118 on the circuit card 114 as shown in FIG. 4.

Two housing members 100 are secured in place on opposite sides of substrate 101 by means of bolts 120 passing through openings (unnumbered) in the support blocks 104. This will bring contacts 116 on the flexible circuit 112 into contact with contact pads 124 on substrate 101.

In this embodiment, the flexible circuit 112 need have contacts and connection lines on only one side thereof since the same side of the flexible circuit 112 that contacts each at the circuit cards 114 also contacts the surface of the substrate 101.

While several embodiments of this invention have been shown and described, it is to be understood that various adaptions and modifications can be made without departing from the scope of the invention as defined in the appended claims.

What is claimed is:

1. An assembly for connecting flexible circuit means to connectors on a substrate member and connections on a card member comprising;
 a housing member;
 first resilient pressure exerting means carried by said housing member and adapted to receive flexible circuit means reeved thereon and positioned to urge said reeved portions of said flexible circuit means against the connectors on the substrate to cause electrical contact;
 second and third individual pressure exerting means carried by said housing independently of each other and of said first pressure exerting means, and being positioned in spaced juxtaposed relationship and defining an opening therebetween;
 locating means to maintain one leg portion of said flexible circuit positioned in contact with the second pressure exerting means and another leg portion of said flexible circuit means positioned in contact with the third pressure exerting means, said two leg portions of said flexible circuit defining therebetween a slot to receive a circuit card; said slot being of less width than the thickness of the circuit card;
 whereby when said card is inserted in said slot and the reeved portion of the flexible circuit means is in contact with the connectors on said substrate a circuit connection is establish between said substrate and said card through said flexible circuit.

2. The assembly as defined in claim 1 wherein each of said pressure exerting means includes a pad of elastomeric material conformally contacting said flexible circuit means.

3. The assembly as claimed in claim 1 wherein said second and third pressure exerting means are oriented transverse to the orientation of the first pressure exerting means whereby to support the card member transverse to the substrate member.

4. The as defined in claim 1 wherein said flexible circuit member is comprised of a pair of flexible circuit members and said first resilient pressure exerting means is comprised of a pair of resilient members; and
  wherein each of said flexible circuit members is reeved around one of said resilient members; and
  wherein one of said flexible circuit members provides one leg portion and the other of said flexible circuit members provides the other leg portion.

5. The assembly as defined in claim 4 wherein compression means are provided to bias said pads of elastomeric material against said flexible circuit means.

6. The assembly as defined in claim 1 wherein said flexible circuit means includes a single flexible circuit member having a central portion reeved around said first pressure exerting means, and wherein said single flexible circuit member provides both leg portions.

7. The assembly as defined in claim 6 wherein said flexible circuit means includes circuit connections on each side thereof and means interconnecting some of the connections on one side to those on the other side.

8. The assembly as defined in claim 1 including means to removably secure said housing to said substrate.

9. The assembly as defined in claim 8 wherein means are provided to interconnect a pair of said housings on opposite sides of said substrate member.

10. An assembly for connecting a pair of flexible circuit members to connectors on a substrate member and connections on a card member comprising;
  a housing member;
  first resilient pressure exerting means carried by said housing member,
  said first pressure exerting means including a pair of block members, each block member having a pressure exerting member disposed thereon, and a flexible arm extending therefrom;
  second and third pressure exerting means, one carried by each of said flexible arms and positioned in spaced juxtaposed relationship and defining an opening therebetween;
  a flexible circuit member reeved around each pressure exerting means and having a portion reeved around each block member and a portion reeved around each resilient arm, the portions of each of said flexible members reeved around their respective resilient arms defining a slot for the reception of a circuit card, which slot has a width less than the thickness of the circuit card;
  whereby when said card is inserted in said slot and the reeved portion of the flexible circuit around each block member is in contact with the connectors on said substrate a circuit connection is established between said substrate and said card through said flexible circuit members.

* * * * *